United States Patent [19]

Taneya et al.

[11] Patent Number: 4,823,353
[45] Date of Patent: Apr. 18, 1989

[54] SEMICONDUCTOR LASER ARRAY APPARATUS

[75] Inventors: Mototaka Taneya, Ibaraki; Mitsuhiro Matsumoto; Sadayoshi Matsui, both of Tenri, all of Japan

[73] Assignee: 501 Sharp Kabushiki Kaisha, Osaka, Japan

[21] Appl. No.: 106,740

[22] Filed: Oct. 8, 1987

[30] Foreign Application Priority Data

Oct. 8, 1986 [JP] Japan .................. 61-239478

[51] Int. Cl.⁴ .............................. H01S 3/119
[52] U.S. Cl. .......................... 372/50; 372/25; 372/29; 372/97; 372/99
[58] Field of Search ............... 372/50, 23, 25, 26, 372/28, 29, 32, 97, 99

[56] References Cited

U.S. PATENT DOCUMENTS 4,246,548  1/1981  Rutz ........................ 372/99
4,624,000  11/1986 Streifer et al. ............ 372/46
4,661,962  4/1987  Clayton .................... 372/29

Primary Examiner—William L. Sikes
Assistant Examiner—Georgia Y. Epps
Attorney, Agent, or Firm—Ciotti & Murashige, Irell & Manella

[57] ABSTRACT

A semiconductor laser array apparatus comprising a semiconductor laser array device having a plurality of active waveguides in a parallel manner with an optical phase-coupling between the adjacent waveguides and an optical phase-shifting means attaining a 180° phase-shift between the adjacent laser beams emitted from the adjacent waveguides of the laser array device, the phase-shifting means being disposed in the vicinity of one of the facets of the laser array device.

7 Claims, 4 Drawing Sheets

SEMICONDUCTOR LASER ARRAY APPARATUS

BACKGROUND OF THE INVENTION

1. Field of the Invention

This invention relates to a semiconductor laser array apparatus which produces high output power beams with a 0° phase-shift between the adjacent laser beams.

2. Description of the Prior Art

Semiconductor laser devices which are useful as light sources for optical discs, laser printers, optical measuring systems, etc., must produce high output power. However, conventional semiconductor laser devices having a single waveguide structure can only produce low output power, 60–70 mW at their best, even taking into account their window effects and/or the reflectivity control at their facets. In order to oscillate laser light in a certain array mode (i.e., a 0° phase-shift mode, resulting in a single narrow beam with higher output power), semiconductor laser array devices, in which a plurality of waveguides are fabricated in a parallel manner to achieve an optical phase-coupling between the adjacent waveguides, have been studied. However, the optical phase-shift between the adjacent waveguides of these devices is, indeed, 180°, and output power light is emitted in a two-beam fashion having a certain angle therebetween, resulting in a far-field pattern having two peaks. Thus, this laser light cannot be condensed into a diffraction limited spot fashion by means of any known optical lens. In order to use these semiconductor laser array devices as light sources of optical discs, laser printers, etc., they must oscillate lasers in a single array mode and emit output power light with a single narrow beam.

FIGS. 4 and 5 show a conventional semiconductor laser array device, which can be produced as follows: On the (001) plane of a p-GaAs substrate 101, an n$^+$-Al$_{0.1}$Ga$_{0.9}$As current blocking layer 102 having a thickness of 0.7 μm and an n-GaAs surface-protective layer 103 having a thickness of 0.1 μm are successively formed by liquid phase epitaxy. Then, three straight channels 108 are formed in a parallel manner through both the surface-protective layer 103 and the current blocking layer 102 into the p-GaAs substrate 101. Each of the channels 108 has a width of 4 μm and a depth of about 1 μm. The distance from the center of one channel to that of the adjacent channel is 5 μm. These channels 108 are disposed at right angles to the (110) plane which corresponds to each of the facets of the device. Then, on the n-GaAs surface-protective layer 103 including the channels 108, a p-Al$_{0.42}$Ga$_{0.58}$As cladding layer 104 having a thickness of 0.2 μm in the portions out of the channels 108, a p- or n-Al$_{0.14}$Ga$_{0.86}$As active layer 105 having a thickness of 0.08 μm an n-Al$_{0.42}$Ga$_{0.58}$As cladding layer 106 having a thickness of 0.8 μm and an n$^+$-GaAs contact layer 107 having a thickness of 1.5 μm are successively formed by liquid phase epitaxy. Since the channels 108 are filled with the p-cladding layer 104, the surface of each of the layers 104, 105, 106 and 107 becomes flat. Then, the upper face of the contact layer 107 and the back face of the substrate 101 are subjected to a vapor deposition treatment with metal materials and then heated to form ohmic contacts thereon made of alloys of the metal materials, followed by cleaving at the (011) plane of the wafer, resulting in a conventional semiconductive laser array device.

The optical field distribution of beams oscillated by the conventional laser array device and the far-field pattern attained by the conventional laser array device are shown in FIGS. 6 and 7, respectively, indicating that the optical phase-shift between the adjacent waveguides is 180°.

The reason why the conventional semiconductor laser array device having a plurality of waveguides is operated in a 180° phase-shift mode is that laser light is absorbed by the optical coupling area between the adjacent waveguides, which makes threshold gain of the 180° phase-shift mode significantly low.

The above-mentioned phenomenon that the conventional laser array device is operated in a 180° phase-shift mode can be also explained by reference to FIG. 8, which shows the dependence of the threshold gain of all possible array modes ($\nu = 1$, 2 and 3) of a triple lasing filament array on the difference in refractive index in the lateral direction. This dependence is obtained by a calculating analysis of the waveguides. It can be also seen from FIG. 8 that the conventional laser array device selectively and stably oscillates laser in a 180° phase-shift mode. As mentioned above, such a 180° phase-shift mode attains a far-field pattern having two peaks, which causes difficulty in condensing the laser light into a diffraction limited spot fashion by means of any known optical lens.

Moreover, the conventional laser array device oscillates laser light in an array mode other than the 0° phase-shift mode and the 180° phase-shift mode, thereby producing output light with a plurality of beams. In addition, two or more array modes are mixed without interference therebetween, thereby producing output light with broad beams.

A semiconductor laser array device having an effective index-guided structure in which optical loss in the optical coupling area is zero has been proposed, which is shown in FIG. 9. The production of this laser array device is as follows: On the (001) plane of an n-GaAs substrate 111, an n-Al$_x$Ga$_{1-x}$As cladding layer 112 having a thickness of 0.8 μm, an n- or p-Al$_y$Ga$_{1-y}$As active layer 113 having a thickness of 0.1 μm, a p-Al$_x$Ga$_{1-x}$As cladding layer 114 having a thickness of 0.8 μm, and a p$^+$-GaAs contact layer 115 having a thickness of 0.1 μm are successively formed by a crystal growth technique such as metal organic-chemical vapor deposition (MOCVD), molecular beam epitaxy (MBE), liquid phase epitaxy (LPE), or the like. Then, ohmic contacts are formed on both sides of the wafer. Three mesa-stripes 116 are then formed in a parallel manner in the wafer by photolithography and a reactive ion-beam etching technique in such a manner that the portion of the p-cladding layer 114 corresponding to the outside of the mesa-stripes 116 has a thickness of 0.3 μm. Each of the mesa-stripes 116 has a width of 3 μm and a height of 1.5 μm. The distance from the center of one mesa-stripe to that of the adjacent mesa-stripe is 4 μm. These mesa-stripes 116 are disposed in the <$\bar{1}$10> direction of the substrate 111. Then, cleavage is carried out at the ($\bar{1}$10) plane of the wafer to form a laser array device 117 having a cavity length of about 250 μm.

The oscillation transverse mode attained by this effective-index guided laser array device is composed of a plurality of array modes. This phenomenon can be explained as follows: This effective-index guided laser array device oscillates lasers in all allowed array modes at the same time because the absorption of light at the optical coupling area does not occur and all of the allowed array modes have the same threshold gain, whereas the laser array device shown in FIG. 4 selectively oscillates laser light in a 180° phase-shift mode because laser light is significantly absorbed by the optical coupling area. The breadth of output beams produced by this laser array device which oscillates laser light in a plurality of array modes is several times that of diffraction limited value, which causes difficulty in practical use of the laser array device.

SUMMARY OF THE INVENTION

The semiconductor laser array apparatus of this invention, which overcomes the above-discussed and numerous other disadvantages and deficiencies of the prior art, comprises a semiconductor laser array device having a plurality of active waveguides in a parallel manner with an optical phase-coupling between the adjacent waveguides and an optical phase-shifting means attaining a 180° phase-shift between the adjacent laser beams emitted from the adjacent waveguides of the laser array device, said phase-shifting means being disposed in the vicinity of one of the facets of the laser array device.

In a preferred embodiment, the distance from the optical phase-shifting means to the facet of the laser array device is 30 μm or less.

In a preferred embodiment, the reflectivity of the facet facing the optical phase-coupling means is 10% or less and that of the other facet is 80% or more.

In a preferred embodiment, the optical phase-shifting means is disposed in the vicinity of the facet at an inclination of 3° or more to the facet in the direction of the normal to said facet.

In a preferred embodiment, the optical absorption coefficient of aid optical phase-shifting means is 5% or less.

In a preferred embodiment, the optical phase-shifting means comprises a glass plate and striped and multi-layered films.

In a preferred embodiment, a glass window of the stem is used as said glass plate.

Thus, the invention described herein makes possible the objective of providing a semiconductor laser array apparatus which oscillates laser in a single array mode at high output power with a single narrow beam.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a semiconductor laser array apparatus, which comprises a semiconductor laser array device with a plurality of waveguides in a parallel manner to achieve an optical phase-coupling between the adjacent waveguides and an optical phase-shifting means disposed in the vicinity of one of the facets of the laser array device. The optical phase-shifting means functions to attain a 180° phase-shift of laser beams with a 180° phase-shift therebetween which are emitted from the adjacent waveguides of the laser array device, resulting in laser beam oscillation with a single beam.

EXAMPLE

Figure 1:
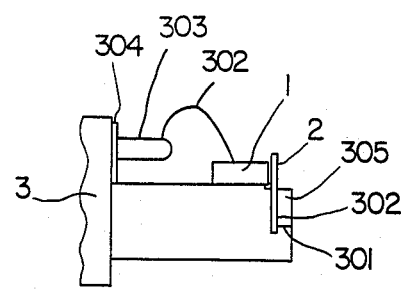
FIG. 1 is a diagram showing a semiconductor laser array apparatus of this invention.
Figure 4:
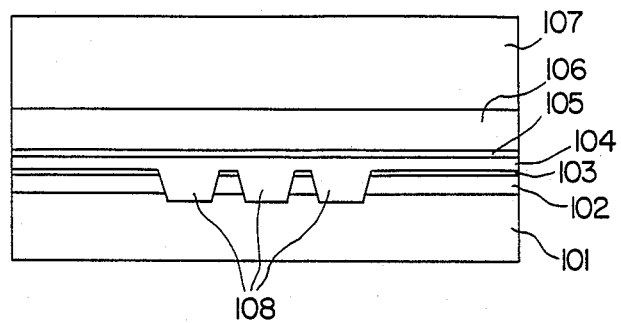
Figure 5:
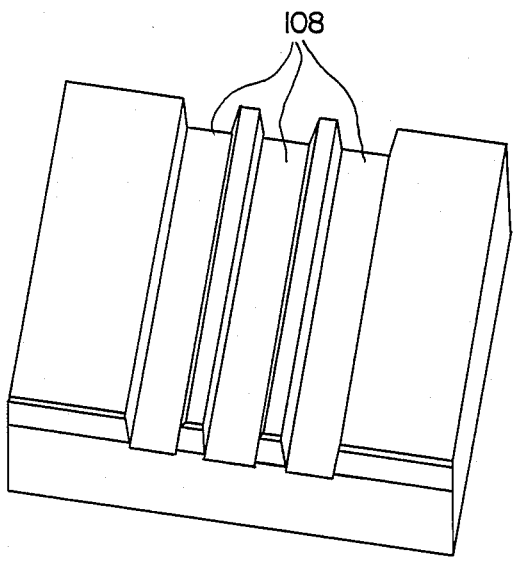
Figure 6:
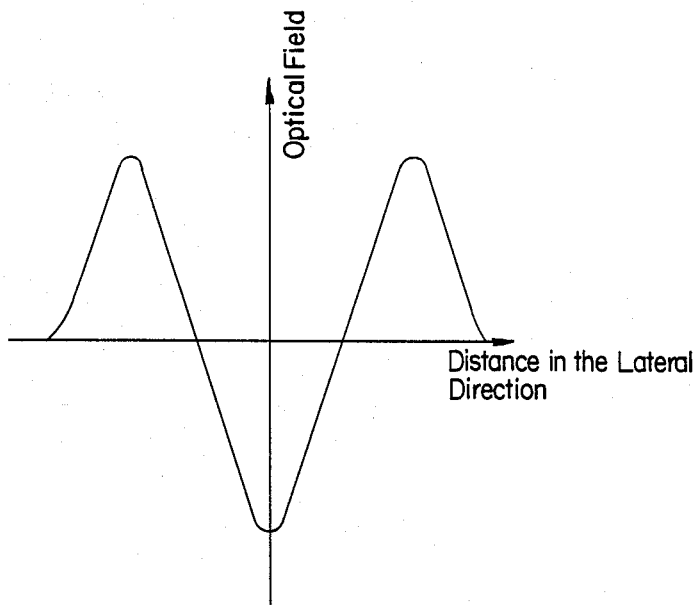
FIG. 6 is a graph showing the optical field distribution of the conventional semiconductor laser array device shown in FIG. 4.
Figure 7:
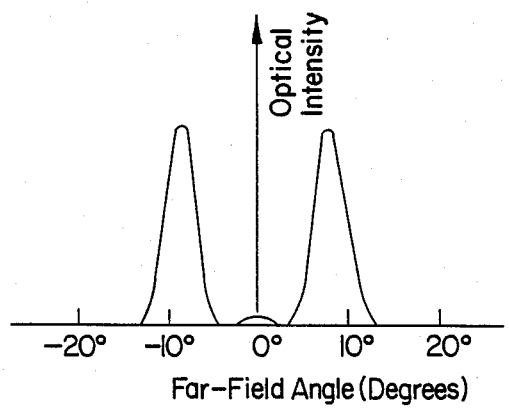
FIG. 7 is a graph showing the far-field pattern attained by the conventional semiconductor laser array device shown in FIG. 4.
Figure 8:
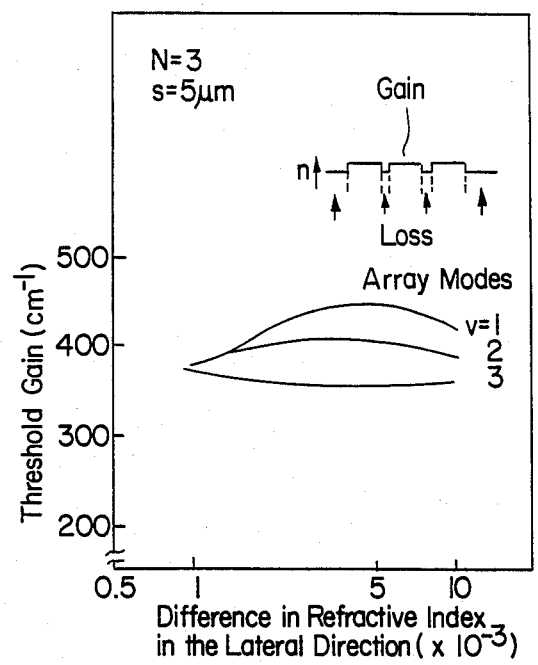
FIG. 8 is a graph showing the dependence of the threshold gain of all possible array modes of the conventional semiconductor laser array device of FIG. 4 on the difference in refractive index in the lateral direction.
Figure 9:
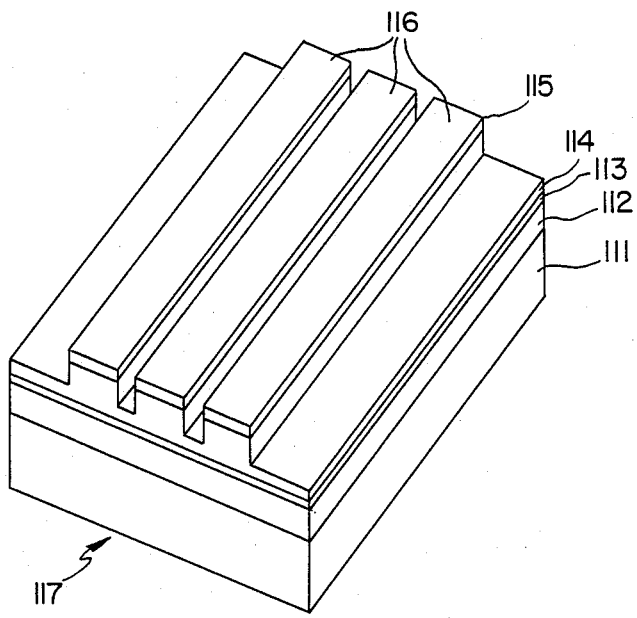
FIG. 9 is a perspective view showing a conventional effective-index guided laser array device.

FIG. 1 shows a semiconductor laser array apparatus of this invention, which comprises an optical-loss guided semiconductor laser array device 1 such as that of the laser array device shown in FIG. 4 and an optical phase-shifting means 2 disposed in the vicinity of the front facet of the laser array device 1.

The array device 1 has a plurality of lasing filaments in a parallel manner as shown in FIG. 4. The method for the production of the laser array device 1 is also the same as that of the laser array device shown in FIG. 4. The distance from the center of one channel to that of the adjacent channel of this laser array device 1 is 5 μm and the oscillation wavelength thereof is 7800 Å. This laser array device 1 oscillates in a single 180° phase-shifting mode up to a high output power level as mentioned above. The rear reflecting face of this laser array device 1 is coated by a multi-layer made of amorphous silicon and $Al_2O_3$ using a vapor deposition technique, resulting in a reflectivity of 7%, and the front reflecting face thereof is coated with $Al_2O_3$ using a vapor deposition technique, resulting in a reflectivity of 80%.

Figure 2:
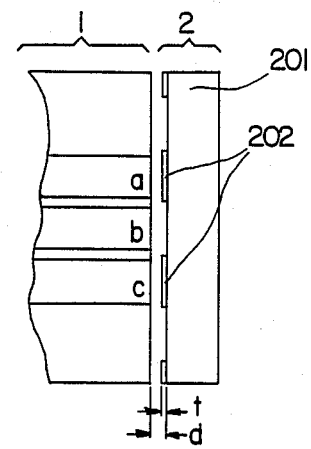
FIG. 2 is a diagram showing an enlarged portion of the semiconductor laser array apparatus shown in FIG. 1.

The semiconductor laser array apparatus of this invention is produced as follows: The semiconductor laser array device 1 is mounted on a stem 3 by a soldering material such as In. The electrode of the laser array device 1 is electrically connected to a lead pin 303 by an aluminum wire 302. A Si-pin 304, which is used to monitor the output of the laser array device 1, is disposed behind the laser array device 1. The portion 305 of the stem 3, which is at the position lower by about 10 μm than the position at which the laser array device 1 is mounted on the stem 3, has a groove 301. In this groove 301, the above-mentioned optical phase-shifting means 2 is fixed by a screw 302. FIG. 2 shows the positional relationship between the laser array device 1 and the optical phase-shifting means 2.

The optical phase-shifting means 2 is, for example, composed of a glass plate 201 with a low expansion coefficient having a thickness of 120 μm and striped silicon nitride films 202 with a refractive index n of 1.96 having a thickness t formed on the glass plate 201. The width of each stripe is 5 μm. The thickness t of each striped silicon nitride film 202 must meet the following equation:

$$n \cdot t = t + (2m+1)(\lambda/2)$$

wherein n is the refractive index of silicon nitride, m is the integers such as 0, 1, 2, 3, ..., and $\lambda$ is the oscillation wavelength of the laser array device.

In this example, the values of n and $\lambda$ are set to be 1.96 and 7800 Å, respectively, namely, n=1.96, $\lambda$=7800 Å, and accordingly, t is represented by the following equation:

$$t = (2m+1) \times 4062.5 \text{ Å}$$

In this example, the value of m is set to be zero, and accordingly, the thickness t of each striped silicon nitride film 202 is 4062.5 Å.

The silicon nitride film 202 with a thickness of 4062.5 Å is formed on the glass plate 201 by plasma assisted chemical vapor deposition. The silicon nitride film 202 is formed into a plurality of stripes by photolithography and an etching technique. The distance from the center of one stripe to that of the adjacent stripe is 10 μm. The function of the optical phase-shifting means 2 is as follows: The laser array device 1 oscillates laser beams having a wavelength of 7800 Å with a 180° phase-shift therebetween as mentioned above. Some portions of the laser beams pass through the glass plate 201 via the striped silicon nitride films 202 and the other portions of the laser beams directly pass through the glass plate 201, resulting in a 180° phase-shift between the adjacent laser beams from the laser array device 1.

Then, the optical phase-shifting means 2 is placed in the groove 301 of the stem 3 at a distance d from the laser array device 1 while current is injected into the laser array device 1 to oscillate laser beams. The distance d from the laser array device 1 to the optical phase-shifting means 2 is determined depending upon the position of the tip of the screw 302 which comes into contact with the optical phase-shifting means 2 in the groove 301 of the stem 3. In this example, the value d is set to be 20 μm (i.e., d=20 μm). The optical phase-shifting means 2 is fixed by the screw 302 in the groove 301 in such a manner that it is inclined at about 3° to the front facet of the laser array device 1 in the direction of the normal to the active layer of the laser array device 1, so that the amount of reflected beams from the optical phase-shifting means 2 to the laser array device 1 can be minimized.

Figure 3:
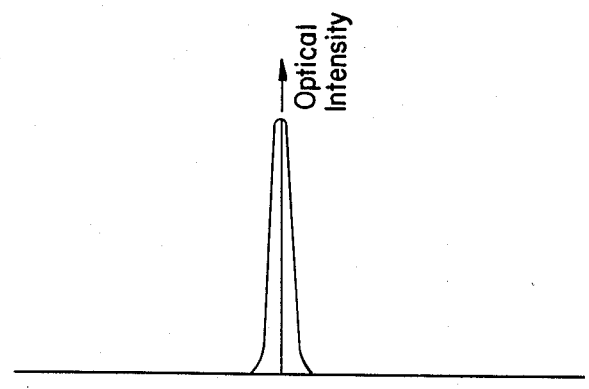
FIG. 3 is a graph showing the far-field pattern attained by the semiconductor laser array apparatus shown in FIG. 1, FIGS. 4 and 5, respectively, are a front sectional view and a perspective view showing a conventional semiconductor laser array device.

The adjustment of the optical phase-shifting means 2 to the above-mentioned specified position in the groove 301 is carried out as follows: The optical phase-shifting means 2 is placed at an inclinating of about 3° to the front facet of the laser array device 1 at the position in the groove 301 of the stem 3, where laser beams from a plurality of lasing filaments (a) to (c) of the laser array device 1 are observed to be separated from each other. Then, the optical phase-shifting means 2 is moved in the parallel direction with regard to the original position and fixed by the screw 301 to the specified position at which the far-field pattern attained by the laser array device 1 is the pattern shown in FIG. 3 indicating that laser beams from the laser array device 1 are concentrated at the center into a single-beam fashion, resulting in a semiconductor laser array apparatus of this invention.

The semiconductor laser array apparatus attains laser oscillation with a single narrow beam up to a high output power level, which is equivalent to the oscillation pattern in a 0° phase-shift mode.

The invention is not limited to the laser array device 1 with the structure mentioned above, but it is, of course, applicable to other laser array devices with a different structure which oscillate in a single 180° phase-shift mode. Moreover, optical phase-shifting means made of materials different from those of the above-mentioned optical phase-shifting means 2, optical phase-shifting means fixed in the groove of the stem by a process different from that of the above-mentioned optical phase-shifting means 2, and semiconductor laser array apparatuses in which the window glass of a stem cap is used as the glass plate of the optical phase-shifting means are, of course, applicable to this invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser array apparatus comprising a semiconductor laser array device having a plurality of active waveguides in a parallel manner with an optical phase-coupling between the adjacent waveguides and an optical phase-shifting means attaining a 180° phase-shift between the adjacent laser beams emitted from the adjacent waveguides of the laser array device, said phase-shifting means being disposed with a gap from the light-emitting facet of the laser array device in the vicinity of the light-emitting facet of the laser array device.

2. A semiconductor laser array apparatus according to claim 1, wherein said gap is 30 μm or less.

3. A semiconductor laser array apparatus according to claim 1, wherein the reflectivity of said facet facing said optical phase-shifting means is 10% or less and that of the other facet is 80% or more.

4. A semiconductor laser array apparatus according to claim 1, wherein said optical phase-shifting means is disposed in the vicinity of the light-emitting facet at an inclination of 3° or more to said facet in the direction of the normal to said facet.

5. A semiconductor laser array apparatus according to claim 1, wherein said optical phase-shifting means comprises a glass plate and multi-layered films disposed on said glass plate, said films being formed into stripes.

6. A semiconductor laser array apparatus according to claim 5, wherein a glass window of the stem is used as said glass plate of said optical phase-shifting means.

* * * * *